United States Patent
Shibata et al.

(10) Patent No.: US 8,232,708 B2
(45) Date of Patent: Jul. 31, 2012

(54) PIEZOELECTRIC THIN FILM ELEMENT, AND PIEZOELECTRIC THIN FILM DEVICE

(75) Inventors: Kenji Shibata, Tsukuba (JP); Hideki Sato, Hamamatsu (JP); Kazufumi Suenaga, Tsuchiura (JP); Akira Nomoto, Kasumigaura (JP)

(73) Assignee: Hitachi Cable, Ltd., Tokyo (JP)

( * ) Notice: Subject to any disclaimer, the term of this patent is extended or adjusted under 35 U.S.C. 154(b) by 163 days.

(21) Appl. No.: 12/816,848

(22) Filed: Jun. 16, 2010

(65) Prior Publication Data

US 2011/0006643 A1 Jan. 13, 2011

(30) Foreign Application Priority Data

Jul. 8, 2009 (JP) .................. 2009-161465

(51) Int. Cl.
*H01L 41/04* (2006.01)
(52) U.S. Cl. ............... 310/358; 252/62.9 R; 310/357
(58) Field of Classification Search ............... 310/357, 310/358; 252/62.9 R
See application file for complete search history.

(56) References Cited

U.S. PATENT DOCUMENTS

| 6,347,862 | B1 * | 2/2002 | Kanno et al. ............... 347/68 |
| 6,385,355 | B1 * | 5/2002 | Nashimoto et al. .......... 385/8 |
| 7,323,806 | B2 * | 1/2008 | Shibata et al. .............. 310/358 |
| 2007/0024162 | A1 * | 2/2007 | Shibata et al. .............. 310/358 |
| 2009/0075066 | A1 * | 3/2009 | Shibata et al. .............. 428/332 |
| 2009/0096328 | A1 * | 4/2009 | Shibata et al. .............. 310/346 |

FOREIGN PATENT DOCUMENTS

JP 20286953 A 10/1998
JP 2007019302 A 1/2007

* cited by examiner

*Primary Examiner* — Walter Benson
*Assistant Examiner* — Bryan Gordon
(74) *Attorney, Agent, or Firm* — Martin Fleit; Paul D. Bianco; Fleit Gibbons Gutman Bongini & Bianco PL

(57) ABSTRACT

To stably provide a KNN piezoelectric thin film element having piezoelectric characteristics replaceable with a PZT thin film. A piezoelectric thin film element includes: a piezoelectric thin film on a substrate, having an alkali niobium oxide series perovskite structure expressed by a general formula $(K_{1-x}Na_x)NbO_3$ ($0<x<1$), wherein an intensity of a higher angle side skirt field is stronger than an intensity of a lower angle side skirt field of a diffraction peak in a KNN (002) diffraction peak in an X-ray diffraction $2\theta/\theta$ pattern of the piezoelectric thin film element.

8 Claims, 11 Drawing Sheets

FIG. 2. (Color online) X-ray diffraction patterns of $(1-x) \times (K_{0.5}Na_{0.5})NbO_3-xLiNbO_3$ ceramics.

FIG. 14A

| | Film forming rate (μm/hr) | Film forming temperature (°C) | target lot | Plasma power (W) | Presence/absence of heat treatment | KNN(002) diffraction peak by XRD measurement | | | | composition Na/(K+Na) | Piezoelectric constant d31 (-pm/V) |
|---|---|---|---|---|---|---|---|---|---|---|---|
| | | | | | | Intensity of diffraction peak | Peak shape | | | | |
| | | | | | | | L(deg) | R(deg) | R/(R+L) | | |
| Example 1 | 0.68 | 700 | 6 | 100 | absence | 700 | 0.419 | 0.442 | 0.51 | 0.531 | 69 |
| Example 2 | 0.65 | 700 | 6 | 100 | absence | 1500 | 0.419 | 0.442 | 0.51 | 0.541 | 75 |
| Com. example 1 | 0.65 | 700 | 6 | 100 | absence | 2000 | 0.372 | 0.360 | 0.49 | 0.511 | 69 |
| Example 3 | 0.65 | 700 | 6 | 100 | absence | 2500 | 0.395 | 0.407 | 0.51 | 0.572 | 68 |
| Com. example 2 | 0.71 | 700 | 6 | 100 | absence | 2000 | 0.395 | 0.395 | 0.50 | 0.557 | 65 |
| Example 4 | 0.71 | 700 | 6 | 100 | absence | 2000 | 0.360 | 0.395 | 0.52 | 0.510 | 73 |
| Example 5 | 0.71 | 700 | 6 | 100 | absence | 2000 | 0.384 | 0.395 | 0.51 | 0.532 | 71 |
| Com. example 3 | 0.70 | 700 | 6 | 100 | absence | 3000 | 0.442 | 0.360 | 0.45 | 0.534 | 64 |
| Example 6 | 0.72 | 690 | 6 | 100 | absence | 2000 | 0.360 | 0.430 | 0.54 | 0.519 | 100 |
| Example 7 | 0.71 | 670 | 6 | 100 | absence | 4000 | 0.314 | 0.349 | 0.53 | 0.497 | 88 |
| Example 8 | 0.71 | 665 | 6 | 100 | absence | 5000 | 0.256 | 0.360 | 0.58 | 0.502 | 99 |
| Com. example 4 | 0.72 | 700 | 5 | 100 | absence | 9000 | 0.291 | 0.279 | 0.49 | 0.522 | 66 |
| Example 9 | 0.75 | 700 | 5 | 75 | absence | 3500 | 0.349 | 0.442 | 0.56 | 0.563 | 99 |
| Example 10 | 0.75 | 700 | 5 | 75 | absence | 2500 | 0.407 | 0.453 | 0.53 | 0.596 | 93 |
| Example 11 | 0.75 | 750 | 5 | 75 | absence | 6000 | 0.291 | 0.442 | 0.60 | 0.609 | 100 |

Note: Com. example → Comparative example

FIG. 14B

| | Film forming rate (μm/hr) | Film forming temperature (°C) | target lot | Plasma power (W) | Presence/absence of heat treatment | KNN(002) diffraction peak by XRD measurement | | | | composition Na/(K+Na) | Piezoelectric constant d31 (-pm/V) |
|---|---|---|---|---|---|---|---|---|---|---|---|
| | | | | | | Intensity of diffraction peak | Peak shape | | | | |
| | | | | | | | L(deg) | R(deg) | R/(R+L) | | |
| Example 12 | 0.72 | 700 | 4 | 70 | absence | 6000 | 0.256 | 0.302 | 0.54 | 0.562 | 97 |
| Example 13 | 0.71 | 700 | 4 | 70 | absence | 3000 | 0.302 | 0.360 | 0.54 | 0.583 | 99 |
| Example 14 | 0.58 | 700 | 4 | 70 | absence | 3000 | 0.360 | 0.395 | 0.52 | 0.501 | 80 |
| Example 15 | 0.73 | 700 | 3 | 100 | absence | 2000 | 0.337 | 0.395 | 0.54 | 0.612 | 99 |
| Example 16 | 0.71 | 700 | 2 | 100 | absence | 2000 | 0.337 | 0.395 | 0.54 | 0.630 | 98 |
| Example 17 | 0.71 | 700 | 2 | 100 | absence | 1000 | 0.419 | 0.477 | 0.53 | 0.600 | 89 |
| Example 18 | 0.71 | 700 | 2 | 100 | absence | 1800 | 0.395 | 0.453 | 0.53 | 0.590 | 85 |
| Example 19 | 0.69 | 700 | 2 | 100 | absence | 400 | 0.488 | 0.500 | 0.51 | 0.595 | 70 |
| Com. example 5 | 0.69 | 700 | 2 | 100 | absence | 700 | 0.488 | 0.442 | 0.48 | 0.603 | 69 |
| Example 20 | 0.69 | 700 | 2 | 100 | absence | 800 | 0.430 | 0.535 | 0.55 | 0.600 | 98 |
| Com. example 6 | 0.71 | 700 | 1 | 100 | absence | 500 | 0.488 | 0.465 | 0.49 | 0.598 | 65 |
| Com. example 7 | 0.71 | 700 | 1 | 100 | absence | 700 | 0.430 | 0.407 | 0.49 | 0.530 | 67 |
| Com. example 8 | 0.71 | 700 | 1 | 100 | absence | 500 | 0.477 | 0.453 | 0.49 | 0.541 | 63 |
| Com. example 9 | 0.71 | 700 | 1 | 100 | absence | 1200 | 0.512 | 0.442 | 0.46 | 0.559 | 64 |
| Example 21 | 0.71 | 700 | 1 | 100 | absence | 1800 | 0.372 | 0.442 | 0.54 | 0.540 | 103 |

Note: Com. example → Comparative example

FIG. 14C

| | Film forming rate (μm/hr) | Film forming temperature (°C) | target lot | Plasma power (W) | Presence/absence of heat treatment | KNN(002) diffraction peak by XRD measurement | | | | | Na/(K+Na) composition | Piezoelectric constant d31 (-pm/V) |
|---|---|---|---|---|---|---|---|---|---|---|---|---|
| | | | | | | Intensity of diffraction peak | L(deg.) | R(deg.) | R/(R+L) | Peak shape | | |
| Example 22 | 0.68 | 700 | 6 | 100 | presence | 700 | 0.419 | 0.465 | 0.53 | | 0.531 | 79 |
| Ref. example 1 | 0.65 | 700 | 6 | 100 | presence | 1500 | 0.442 | 0.419 | 0.49 | | 0.541 | 65 |
| Example 23 | 0.65 | 700 | 6 | 100 | presence | 2000 | 0.407 | 0.442 | 0.52 | | 0.511 | 76 |
| Example 24 | 0.65 | 700 | 6 | 100 | presence | 2500 | 0.419 | 0.465 | 0.53 | | 0.572 | 77 |
| Example 25 | 0.71 | 700 | 6 | 100 | presence | 2000 | 0.407 | 0.442 | 0.52 | | 0.557 | 79 |
| Example 26 | 0.71 | 700 | 6 | 100 | presence | 2000 | 0.384 | 0.442 | 0.54 | | 0.510 | 99 |
| Example 27 | 0.71 | 700 | 6 | 100 | presence | 2000 | 0.407 | 0.465 | 0.53 | | 0.532 | 81 |
| Example 28 | 0.70 | 700 | 6 | 100 | presence | 3000 | 0.314 | 0.477 | 0.60 | | 0.534 | 108 |
| Example 29 | 0.72 | 690 | 6 | 100 | presence | 2000 | 0.372 | 0.512 | 0.58 | | 0.519 | 105 |
| Example 30 | 0.71 | 670 | 6 | 100 | presence | 4000 | 0.302 | 0.442 | 0.59 | | 0.497 | 101 |
| Example 31 | 0.71 | 665 | 6 | 100 | presence | 5000 | 0.291 | 0.419 | 0.59 | | 0.502 | 107 |
| Example 32 | 0.72 | 700 | 5 | 75 | presence | 9000 | 0.244 | 0.384 | 0.61 | | 0.522 | 104 |
| Example 33 | 0.75 | 700 | 5 | 75 | presence | 3500 | 0.372 | 0.453 | 0.55 | | 0.563 | 98 |
| Example 34 | 0.75 | 700 | 5 | 75 | presence | 2500 | 0.360 | 0.500 | 0.58 | | 0.596 | 99 |
| Example 35 | 0.75 | 750 | 5 | 75 | presence | 6000 | 0.291 | 0.465 | 0.62 | | 0.609 | 110 |

Note: Ref. example → Reference example

FIG. 14D

| | Film forming rate (μm/hr) | Film forming temperature (°C) | target lot | Plasma power (W) | Presence/absence of heat treatment | KNN (002) diffraction peak by XRD measurement | | | | Na/(K + Na) composition | Piezoelectric constant d31 (-pm/V) |
|---|---|---|---|---|---|---|---|---|---|---|---|
| | | | | | | Intensity of diffraction peak | L(deg.) | Peak shape R(deg.) | R/(R+L) | | |
| Example 36 | 0.72 | 700 | 4 | 70 | presence | 6000 | 0.244 | 0.372 | 0.60 | 0.562 | 99 |
| Example 37 | 0.71 | 700 | 4 | 70 | presence | 3000 | 0.291 | 0.465 | 0.62 | 0.583 | 113 |
| Example 38 | 0.58 | 700 | 4 | 70 | presence | 3000 | 0.302 | 0.547 | 0.64 | 0.501 | 116 |
| Example 39 | 0.73 | 700 | 3 | 100 | presence | 2000 | 0.302 | 0.477 | 0.61 | 0.612 | 110 |
| Example 40 | 0.71 | 700 | 2 | 100 | presence | 2000 | 0.314 | 0.581 | 0.65 | 0.630 | 113 |
| Example 41 | 0.71 | 700 | 2 | 100 | presence | 1000 | 0.395 | 0.581 | 0.60 | 0.600 | 108 |
| Example 42 | 0.71 | 700 | 2 | 100 | presence | 1600 | 0.349 | 0.570 | 0.62 | 0.590 | 105 |
| Example 43 | 0.71 | 700 | 2 | 100 | presence | 400 | 0.453 | 0.465 | 0.51 | 0.595 | 75 |
| Example 44 | 0.69 | 700 | 2 | 100 | presence | 700 | 0.500 | 0.581 | 0.54 | 0.603 | 99 |
| Example 45 | 0.69 | 700 | 2 | 100 | presence | 800 | 0.395 | 0.593 | 0.60 | 0.600 | 101 |
| Example 46 | 0.71 | 700 | 1 | 100 | presence | 500 | 0.500 | 0.523 | 0.51 | 0.598 | 81 |
| Ref. example 2 | 0.71 | 700 | 1 | 100 | presence | 700 | 0.442 | 0.442 | 0.50 | 0.530 | 80 |
| Example 47 | 0.71 | 700 | 1 | 100 | presence | 500 | 0.419 | 0.465 | 0.53 | 0.541 | 83 |
| Example 48 | 0.71 | 700 | 1 | 100 | presence | 1200 | 0.395 | 0.535 | 0.58 | 0.559 | 106 |
| Example 49 | 0.71 | 700 | 1 | 100 | presence | 1800 | 0.395 | 0.477 | 0.55 | 0.540 | 102 |

Note: Ref. example → Reference example

PIEZOELECTRIC THIN FILM ELEMENT, AND PIEZOELECTRIC THIN FILM DEVICE

The present application is based on Japanese Patent Application No. 2009-161465, filed on Jul. 8, 2009, the entire contents of which are hereby incorporated by reference.

BACKGROUND

1. Technical Field

The present invention relates to a piezoelectric thin film element using a piezoelectric thin film, and a piezoelectric thin film device.

2. Description of Related Art

A piezoelectric material is processed into various piezoelectric elements in accordance with various purposes, and is widely utilized as an actuator for particularly adding voltage and generating deformation, and as functional electronic components such as a sensor that generates voltage from the deformation reversely. As the piezoelectric material utilized for the purpose of the actuator and the sensor, a lead-based material having excellent piezoelectric characteristics, and particularly $Pb(Zr_{x-1}Ti_x)O_3$, which is particularly called PZT (described as PZT hereinafter) based perovskite-type ferroelectric material has been widely used heretofore, and which is normally formed by sintering oxide composed of an individual element. At present, reduction in size and high performance of the piezoelectric element are strongly requested, while achieving the size reduction and high performance of each kind of electronic component.

However, regarding the piezoelectric material prepared by a sintering method-based manufacturing method, being a conventional manufacturing method, as its thickness is set to be thinner, and particularly as its thickness is set closer to a thickness of about 10 μm, the size of the piezoelectric material is closer to the size of a crystal grain constituting the material, and its influence can be hardly ignored. Therefore, there is a problem that variation of the characteristics and deterioration are remarkably generated, and in order to avoid such a problem, a forming method of the piezoelectric material, to which a thin film technique replacing the sintering method is applied, has been studied in recent years. Recently, a PZR thin film formed on a silicon substrate by a sputtering method is put to practical use as a piezoelectric thin film of an actuator for a high-speed and high-definition ink jet printer head (for example, see patent document 1).

Meanwhile, a piezoelectric sintered compact and a piezoelectric thin film composed of the aforementioned PZT contain about 60 to 70 wt % of lead, and therefore they are not preferable from an ecological viewpoint and from an aspect of pollution control. Therefore, development of the piezoelectric body not containing lead is desired in consideration of an environment. At present, various non-lead piezoelectric materials are examined, including potassium sodium niobate expressed by a general formula: $(K_{1-x}Na_x)NbO_3$ ($0<x<1$) [described as KNN hereinafter]. Such a KNN is a material having a perovskite structure, and shows relatively excellent piezoelectric characteristics as a non-lead material, and therefore is expected as a strong candidate for the non-lead piezoelectric material (for example see patent document 2).

(Patent Document 1)
Japanese Patent Laid Open Publication No. 10-286953
(Patent document 2)
Japanese Patent Laid Open Publication No. 2007-19302

However, the aforementioned KNN thin film is formed on a silicon substrate by a film forming method such as a sputtering method and a PLD method. However, a stable manufacturing method has not been established, and the present situation is that application to a product is difficult.

In order to solve the above-described problem, an object of the present invention is to stably provide a piezoelectric thin film element and a piezoelectric thin film device.

According to a first aspect of the present invention, there is provided a piezoelectric thin film element, including:

a piezoelectric thin film on a substrate, having an alkali niobium oxide series perovskite structure expressed by a general formula $(K_{1-x}Na_x)NbO_3$ ($0<x<1$);

wherein an intensity of a higher angle side skirt field is stronger than an intensity of a lower angle side skirt field of a diffraction peak, in a KNN (002) diffraction peak in an X-ray diffraction 2θ/θ pattern of the piezoelectric thin film element.

According to a second aspect of the present invention, there is provided a piezoelectric thin film device; including:

a piezoelectric thin film on a silicon substrate, having an alkali niobium oxide series perovskite structure expressed by a general formula $(K_{1-x}Na_x)NbO_3$ ($0<x<1$) provided on a silicon substrate, wherein in the KNN (002) diffraction peak in the X-ray diffraction 2θ/θ pattern of the piezoelectric thin film element, when the diffraction peak angle is set to $(2\theta_p)$, an angle showing the intensity of the lower angle side skirt field of the diffraction peak is set to $(2\theta_{L1/20})$, and an angle showing the intensity of 1/20 of a peak intensity in the higher angle side skirt field of the diffraction peak is set to $(2\theta_{R1/20})$ so as to satisfy $R=(2\theta_{R1/20})-(2\theta_P)$, $L=(2\theta_P)-(2\theta_{L1/20})$, the value of $R/(R+L)$ is 0.54 or more.

In these cases, preferably a crystal structure of the $(K_{1-x}Na_x)NbO_3$ ($0<X<1$) is set in a phase boundary state of a pseudo-cubic crystal and an orthorhombic crystal. Further, preferably Na composition x of a piezoelectric thin film having an alkali niobate oxide series perovskite structure expressed by a general formula $(K_{1-x}Na_x)NbO_3$ ($0<X<1$), satisfies $0.49 \leq x \leq 0.63$.

Further, preferably a lower electrode may be formed between the silicon substrate and the piezoelectric thin film, and an upper electrode may be formed on the piezoelectric thin film.

According to the third aspect of the present invention, the piezoelectric thin film device is provided, including: a piezoelectric thin film element, and a voltage applying part or a voltage detecting part.

According to the fourth aspect of the present invention, in the manufacturing method of the piezoelectric tin film element having the step of forming an alkali niobate oxide series perovskite structure expressed by the general formula $(K_{1-x}Na_x)NbO_3$ ($0<x<1$) on a silicon substrate by sputtering, the step of forming the piezoelectric thin film element includes the step of cooling the piezoelectric thin film to a room temperature after forming the piezoelectric thin film by sputtering, and further applying heat treatment thereto, so that when the diffraction peak angle is set to $(2\theta_p)$, an angle showing the intensity of the lower angle side skirt field of the diffraction peak is set to $(2\theta_{L1/20})$, and an angle showing the intensity of 1/20 of a peak intensity in the higher angle side skirt field of the diffraction peak is set to $(2\theta_{R1/20})$, satisfying $R=(2\theta_{R1/20})-(2\theta_P)$, $L=(2\theta_P)-(2\theta_{L1/20})$, the value of $R/(R+L)$ is 0.54 or more.

BRIEF DESCRIPTION OF THE DRAWINGS

FIG. 1A shows an overall view and FIG. 1B shows a partial expanded view.

FIG. 14A to FIG. 14D are views showing a list of sputter film forming conditions, presence/absence of heat treatment after film formation, Na composition ratio of KNN film, KNN (002) diffraction peak shape, and piezoelectric constant $d_{31}$.

DESCRIPTION OF PREFERRED
EMBODIMENTS OF THE INVENTION

Preferred embodiments of the present invention will be described hereinafter.

Generally, in a piezoelectric thin film element having a piezoelectric thin film of an alkali niobium oxide series perovskite structure, an $SiO_2$ layer, being a thermal oxide film, is formed on a surface of a Si substrate, and a Ti adhesive layer is formed on this $SiO_2$ layer, and further a Pt electrode is provided, and a KNN film is formed on this Pt electrode by a sputtering method. This KNN film is oriented in a surface direction of Pt. The KNN film is expressed by a general formula $(K_{1-x}Na_x)NbO_3$ (0<x<1). Note that structural substrates up to the pt electrode including the KNN film are simply called KNN film/Pt electrode/Ti adhesive layer/$SiO_2$ layer/Si substrate. Also, the structural substrates up to the Pt electrode excluding the KNN film are also simply called Pt electrode/Ti adhesive layer/$SiO_2$ layer/Si substrate.

In this embodiment, a KNN (002) diffraction peak of 2θ=43° to 47° in the KNN thin film is focused. As a result of various experiments conducted by inventors of the present invention, it is found that the piezoelectric constant of the KNN thin film is a high value, when the intensity of the higher angle side skirt field is stronger than the intensity of the lower angle side skirt field of the KNN (002) diffraction peak, in the KNN thin film formed by the sputtering method, having high orientation in KNN (001) surface.

When the intensity of the higher angle side skirt field is stronger than the intensity of the lower angle side skirt field of the KNN (002) diffraction peak, the KNN piezoelectric thin film element having a high piezoelectric constant, for example, the piezoelectric constant of −68 pm/V or more, can be stably manufactured. Note that regarding the piezoelectric constant, "or more" means that an absolute value is great.

Note that the X-ray diffraction measurement in this example was performed by using "X' PertPRO MRD" (X-ray source: 45 kV, 40 mA, Cu Line Focus, incident optical system: Hybrid monochrome meter, light reception optical system: parallel plate collimator [0.09 deg] is installed) produced by PANalytical Co., Ltd. capable of precisely measuring the X-ray diffraction to the fourth decimal places in the XRD2θ/θ measurement of oriented polycrystal.

Figure 3:
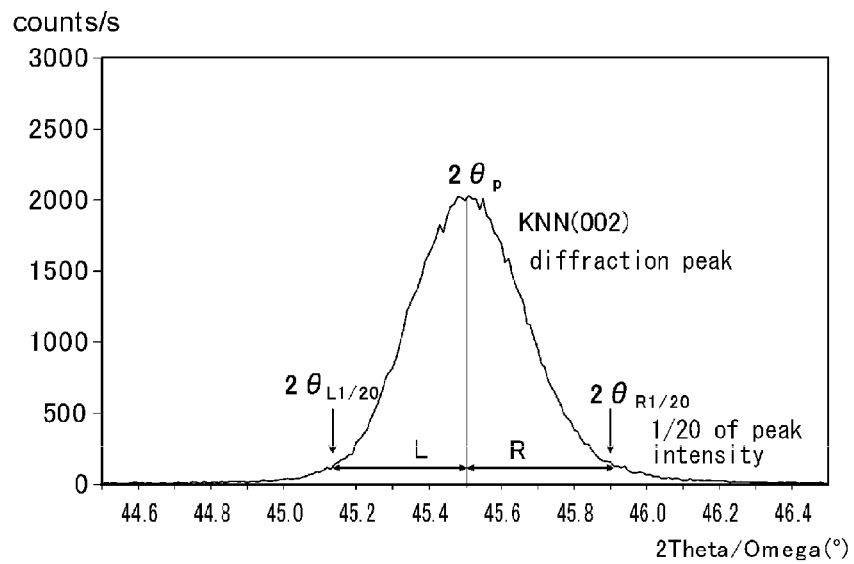
FIG. 3 is a view showing a KNN (002) diffraction peak of the KNN thin film according to an embodiment of the present invention, and shows an expanded view of a diffraction peak of a profile obtained by performing X-ray diffraction measurement (general 2θ/θ).

In this case, particularly as shown in FIG. 3, when a peak angle is set to $(2\theta_P)$, an angle showing the intensity of 1/20 of a peak intensity in the lower angle side skirt field of the peak is set to $(2\theta_{L1/20})$, an angle showing the intensity of 1/20 of the peak intensity in the higher angle side skirt field of the peak is set to $(2\theta_{R1/20})$ so as to satisfy $R=(2\theta_{R1/20})-(2\theta_P)$, $L=(2\theta_P)-(2\theta_{L1/20})$, then the piezoelectric constant becomes suddenly high and the piezoelectric constant becomes −90 pm/V or more, when the value of R/(R+L) is 0.54 or more, compared with a case that this value is under 0.54. Note that a case that the intensity of the higher angle side skirt field is stronger than the intensity of the lower angle side skirt field of the KNN (002) diffraction peak, means a case that the value of R/(R+L) exceeds 0.50.

Note that the peak angle shown in FIG. 3 and $2\theta_{L1/20}$, $2\theta_{R1/20}$ are angles obtained from a smooth graph obtained by fitting using Split Pseudo Voigt (PV) function.

Figure 1A:
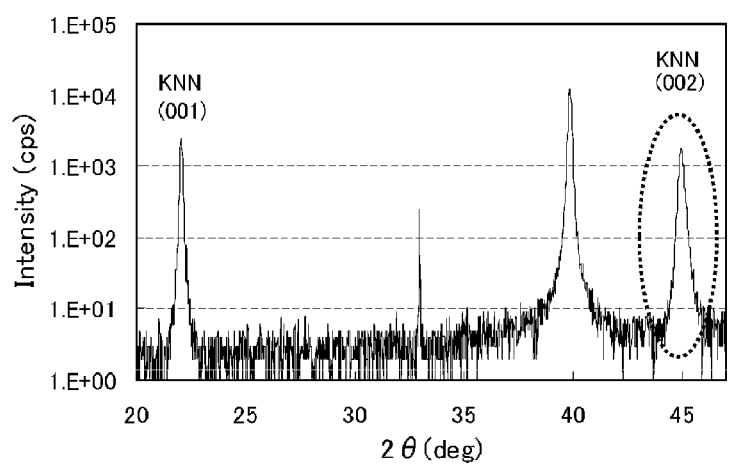
FIG. 1A is a view showing an X-ray diffraction 2θ/θ pattern of a KNN thin film/Pt lower electrode Ti adhesive layer/ $SiO_2$ thermal oxide film/Si substrate according to an embodiment of the present invention.
Figure 1B:
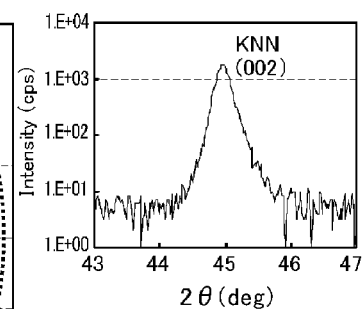
Figure 2A:
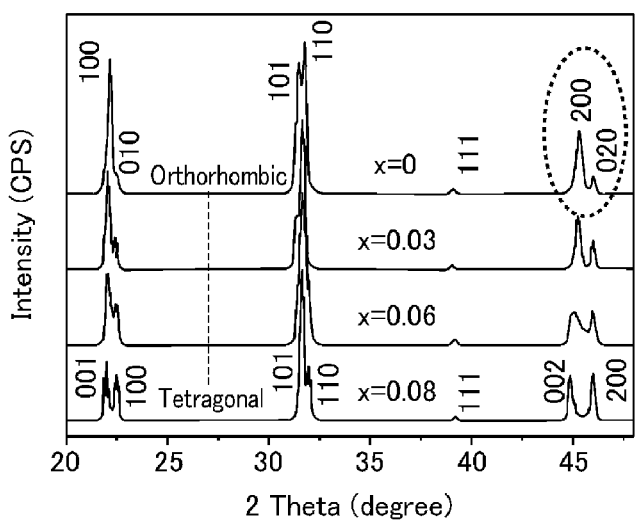
FIG. 2A is a view showing an X-ray diffraction 2θ/θ pattern of a KNN sintered compact of a conventional example.
Figure 2B:
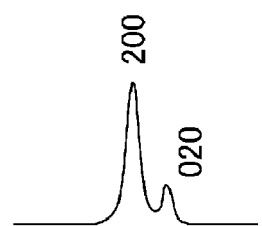
FIG. 2B is a partial expanded view.

A typical X-ray diffraction 2θ/θ pattern of the KNN film (thickness of 3 μm) having the aforementioned orientation is shown in FIG. 1A and FIG. 1B. Further, the X-ray diffraction 2θ/θ pattern of the KNN sintered compact having no orientation is shown in FIG. 2A and FIG. 2B for comparison. FIG. 2A and FIG. 2B show a citation from a document (Ke Wang and Jing-Feng Li: Appl. Phys. Lett. 91 (2007) 262902).

In FIG. 1A, FIG. 1B, and FIG. 2A, FIG. 2B, when a diffraction peak shape of KNN (002), (200), (020) that exist at angles of 2θ=43 to 47° is focused, it is found that one of the KNN sintered compacts (see FIG. 2) has two diffraction peaks, and is formed into an orthorhombic crystal. Meanwhile, it is found that the KNN thin film formed by the sputtering method (see FIG. 1) has only one KNN (002) peak and is formed in pseudo-cubic crystal having orientation in KNN (001) surface.

Figure 4:
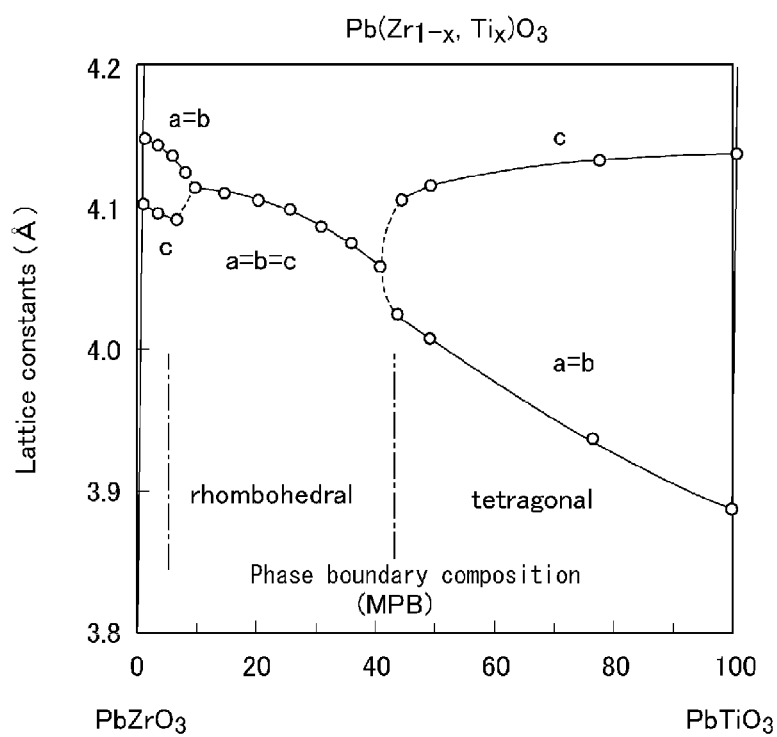
FIG. 4 is a view showing a phase boundary composition in PZT of a conventional example.

Generally, in the piezoelectric material and the piezoelectric thin film having a crystal structure of the perovskite structure, extremely excellent piezoelectric characteristics can be obtained in a phase boundary composition (MPB). For example, as shown in FIG. 4, in a case of $Pb(Zr_{1-x}Ti_x)O_3$ (PZT), MPB formed in a rhombohedral crystal and in a tetragonal crystal exists in the vicinity of x=0.47, and in this composition, extremely excellent piezoelectric characteristics are realized.

In the KNN thin film, when Na composition ratio x of a general formula expressed by $(K_{1-x}Na_x)NbO_3$ (0<x<1) satisfies $0.49 \leq x \leq 0.63$, an MPB state of the pseudo-cubic crystal and the orthorhombic crystal can be stably created, and in this composition, extremely excellent piezoelectric characteristics can be realized (FIG. 14A to FIG. 14D).

As described above, a typical KNN thin film formed by the sputtering method has the pseudo-cubic crystal. Originally, although KNN is a material having the orthorhombic system, it can be considered that KNN is put under restraint of the pseudo-cubic crystal, under an influence of being formed in an appearance of being oriented on a substrate.

It is considered that a profile of the diffraction peak, in which the intensity of the higher angle side skirt field is strong, shows the MPB state of the orthorhombic crystal having a double peak in the vicinity of 45° shown in FIG. 2, and the pseudo-cubic crystal shown in FIG. 1.

As described above, inventors of the present invention succeed in creating the KNN thin film in the MPB state of the pseudo-cubic crystal and the orthorhombic crystal. The KNN thin film in the MPB state of the pseudo-cubic crystal and the orthorhombic crystal, namely, the KNN thin film, with a stronger intensity set in the higher angle side skirt field in the KNN (002) diffraction peak, can be stably created by optimizing sputter film forming conditions (film forming temperature, pressure, degree of vacuum, and charged power, etc,) and further by heat treatment after film formation.

Particularly, the KNN thin film can be controlled in a desired MPB state by applying heat treatment thereto after film formation.

A manufacturing method of the piezoelectric thin film element of this embodiment includes the steps of:

forming a lower electrode on a silicon substrate;

forming the piezoelectric thin film having an alkali niobium oxide series perovskite structure expressed by a general formula $(K_{1-x}Na_x)NbO_3$ (0<x<1), on the lower electrode by the sputtering method; and forming an upper electrode on the piezoelectric thin film, wherein the step of forming the piezoelectric thin film includes the step of optimizing the film forming conditions using the sputtering method, and optimizing the piezoelectric thin film, and applying heat treatment after film formation, so that the value of R/(R+L) is 0.54 or more, when the diffraction peak angle is set to $(2\theta_P)$, the angle showing the intensity of $\frac{1}{20}$ of the peak intensity in the lower angle side skirt field of the diffraction peak is set to $(2\theta_{L1/20})$, the angle showing the intensity of $\frac{1}{20}$ of the peak intensity in the higher angle side skirt field of the diffraction peak is set to $(2\theta_{R1/20})$ so as to satisfy $R=(2\theta_{R1/20})-(2\theta_P)$, $L=(2\theta_P)-(2\theta_{L1/20})$ in the KNN (002) diffraction peak in the X-ray diffraction $2\theta/\theta$ pattern of the piezoelectric thin film element.

As described above, according to one or more embodiments of the present invention, in the KNN thin film having high orientation in the KNN (001) surface formed by the sputtering method, the intensity of the higher angle side skirt field is stronger than the intensity of the lower angle side skirt field of the KNN (002) diffraction peak, and therefore the KNN piezoelectric thin film element having high piezoelectric constant of −68 pm/V or more can be stably provided.

Further, according to one or more embodiments of the present invention, the piezoelectric constant of the KNN thin film element can be set to −90 pm/V or more, particularly when the value of R/(R+L) is 0.54 or more. The KNN thin film is formed on the silicon substrate by the film forming method such as a sputtering method and a PLD method, and there is a report that $d_{31}=-100$ pm/V, being a characteristic of a practical level, is achieved. However, no stably manufacturing method has been established yet, and the conventional art is that application to a product is difficult. Further, in order to widely apply the KNN thin film to an ink jet printer head, at least piezoelectric constant $d_{31}=-90$ pm/V or more must be stably achieved. In this point, as described above, this embodiment is capable of stably realizing the KNN piezoelectric thin film element, satisfying piezoelectric constant $d_{31}=-90$ pm/V or more, and application to the product is easy.

Accordingly, the KNN piezoelectric thin film element having piezoelectric characteristics replaceable with a PZT thin film can be stably provided.

Further, according to one or more embodiments of the present invention, the crystal structure of $(K_{1-x}Na_x)NbO_3$ (0<x<1) is set in a phase boundary state (MPB) of the pseudo-cubic crystal and the orthorhombic crystal, and therefore extremely excellent piezoelectric characteristics can be realized.

Further, according to one or more embodiments of the present invention, Na composition ratio x of the general formula expressed by $(K_{1-x}Na_x)NbO_3$ (0<x<1) satisfies $0.49 \leq x \leq 0.63$. Therefore, the crystal structure of the KNN piezoelectric thin film can be set in a MPB state of the pseudo-cubic crystal and the orthorhombic crystal, thereby realizing extremely excellent piezoelectric characteristics.

Further, according to one or more embodiments of the present invention, the KNN thin film is subjected to heat treatment after film formation. Therefore, the KNN thin film can be stably manufactured, with stronger intensity of the higher angle side skirt field in the KNN (002) diffraction peak.

In addition, according to this embodiment, Pt is used in the lower electrode. However, similar effects can be expected even when using an alloy containing Pt, Au, Ru, Ir, or metal oxide electrodes such as $SrRuO_3$, $LaNiO_3$. Also, as a substrate, Si substrate, having (100) surface orientation attached with a thermal oxide film, is used. However, similar effects can be obtained even in the Si substrate having different surface orientation and in the Si substrate without thermal oxide film, and also in the SOI substrate. Moreover, other than the Si substrate, a quartz glass substrate, a GaAs substrate, a sapphire substrate, a metal substrate such as stainless, an MgO substrate, and a $SrTiO_3$ substrate, etc, may also be used. Although other elements are not particularly added to the KNN piezoelectric thin film, the similar effects can be obtained even in a case of adding 5 atm. % or less Li, Ta, Sb, Ca, Cu, Ba, and Ti, etc, to the KNN piezoelectric thin film.

EXAMPLES

Examples (examples 1 to 49), in which the piezoelectric thin film element containing (K, Na)NbO$_3$ thin film having film thickness of 3 μm will be explained hereinafter, together with comparative examples (comparative examples 1 to 9) and reference example (reference examples 1 and 2) (FIG. 14A to FIG. 14D).

Figure 5:
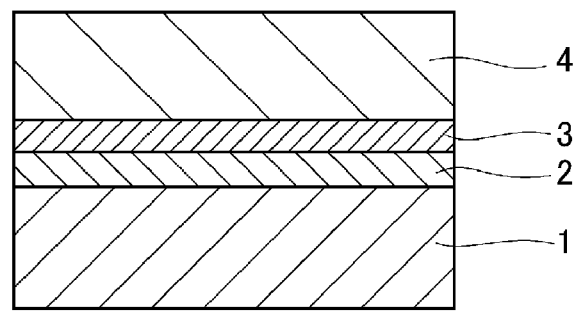
FIG. 5 is a sectional schematic view of a piezoelectric thin film element commonly-utilized by an example and a conventional example.

FIG. 5 shows a sectional view of the structure of the piezoelectric thin film element, being a sample commonly-utilized by the examples and the comparative examples. The Si substrate attached with the thermal oxide film was used as the substrate. This substrate is a circular-shaped substrate with diameter of 4 inches, and is composed of an Si substrate 1 having (100) surface orientation and a thickness of 0.5 mm, and a thermal oxide film 2 having a thickness of 200 nm formed thereon. First, a lower electrode layer 3 was formed on this substrate by an RF magnetron sputtering method. The lower electrode layer 3 is composed of a Ti adhesive layer formed on the thermal oxide film 2 having a film thickness of 2 nm, and a Pt lower electrode formed thereon preferentially oriented in (111) surface having a film thickness of 200 nm. Note that (111) preferentially oriented Pt thin film also functions as an orientation control layer to the KNN film.

The lower electrode layer 3 composed of the Ti adhesive layer and the Pt lower electrode was formed under conditions of: substrate temperature set to 300° C., discharge power set to 200 W, introduced gas Ar atmosphere and pressure set to 2.5 Pa, film forming time set to 1 to 3 minutes (Ti adhesive layer) and 10 minutes (Pt lower electrode).

3 μm of the $(K_{1-x}Na_x)NbO_3$ thin film was formed on the lower electrode layer 3 by the RF magnetron sputtering method. The $(K_{1-x}Na_x)NbO_3$ piezoelectric thin film was formed by using a $(K_{1-x}Na_x)NbO_3$ sintered compact, using (K+Na)/Nb=1.0 ((K, Na) composition ratio) and Na/(K+Na)=0.50 to 0.65 (Na composition ratio) as a target. The $(K_{1-x}Na_x)NbO_3$ thin film was formed under conditions of the substrate temperature set to 665 to 7500° C., the discharge power set to 75 to 100 W, and the introduced gas Ar atmosphere and pressure set to 0.4 Pa. A film forming rate is slightly different, depending on a target lot. Therefore, the film forming rate was slightly adjusted so that the film thickness becomes approximately 3 μm in each film formation. Also, regarding several samples (examples 22 to 49, and reference examples 1 and 2), after film formation, namely after film formation by sputtering, the samples were completely cooled to a room temperature and thereafter were subjected to heat treatment for 1 hour at 650° C. in an atmospheric pressure.

Thereafter, an X-ray diffraction measurement (general 2θ/θ scan) was performed to a sample having a sectional structure of the KNN thin film [3 μm]/Pt[200 nm]/Ti[2 nm]/thermal oxide film [200 nm]/Si substrate, and KNN (002) diffraction peak (peak with 2θ angle of about 45°) was expanded, then KNN (002) diffraction peak intensity satisfying $R=(2\theta_{R1/20})-(2\theta_p)$, $L=(2\theta_p)-(2\theta_{L1/2 0})$ was read, to thereby obtain R/(R+L). In addition, the composition of the KNN film was measured by EDX (an energy dispersion type X-ray analyzer).

Thereafter, in order to evaluate piezoelectric constant $d_{31}$ of the KNN thin film 4, as shown in FIG. 6, a Pt upper electrode 5 having a film thickness of 20 nm was formed on the KNN thin film 4 of the sample by the RF magnetron sputtering method, to thereby cut out a reed-shape (rectangular shape) in a length of 20 mm and width of 2.5 mm, and prepare a long (rectangular strip) piezoelectric thin film element including the KNN piezoelectric thin film 4.

Figure 6A:
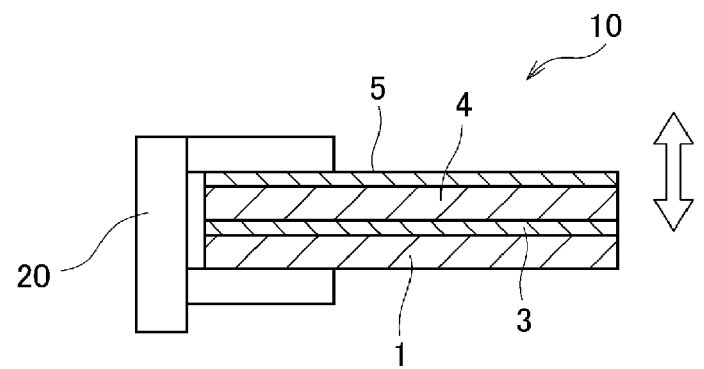
FIG. 6A is an outline view of method for evaluation of piezoelectric constant $d_{31}$ according to an embodiment of the present invention.
Figure 6B:
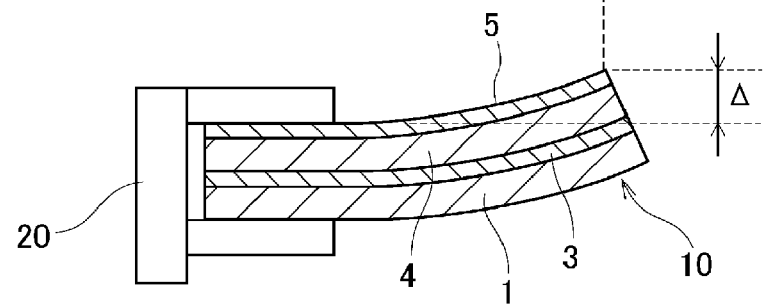
FIG. 6B is an outline view of a displacement of a tip end.
Figure 7:
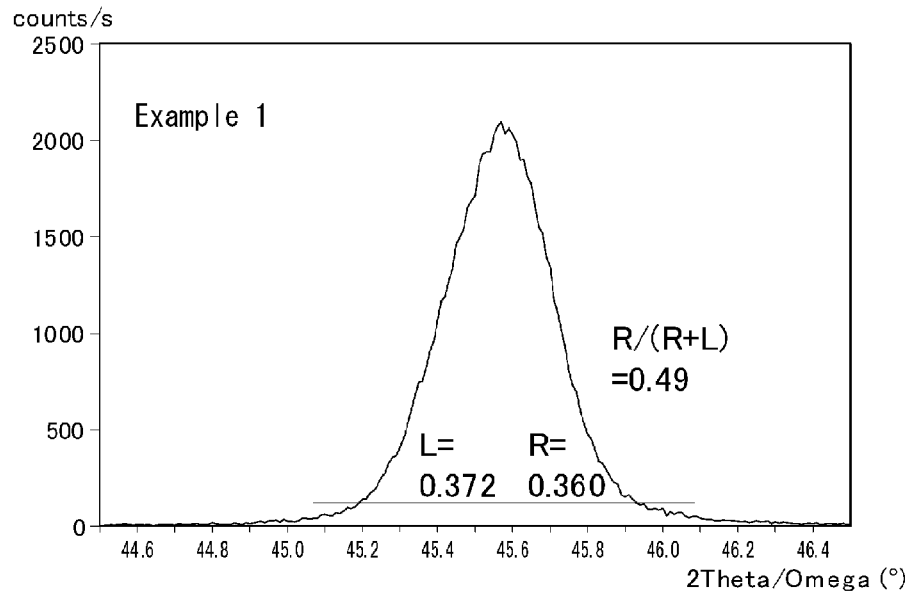
FIG. 7 is a profile of a KNN (002) diffraction peak of example 1.
Figure 8:
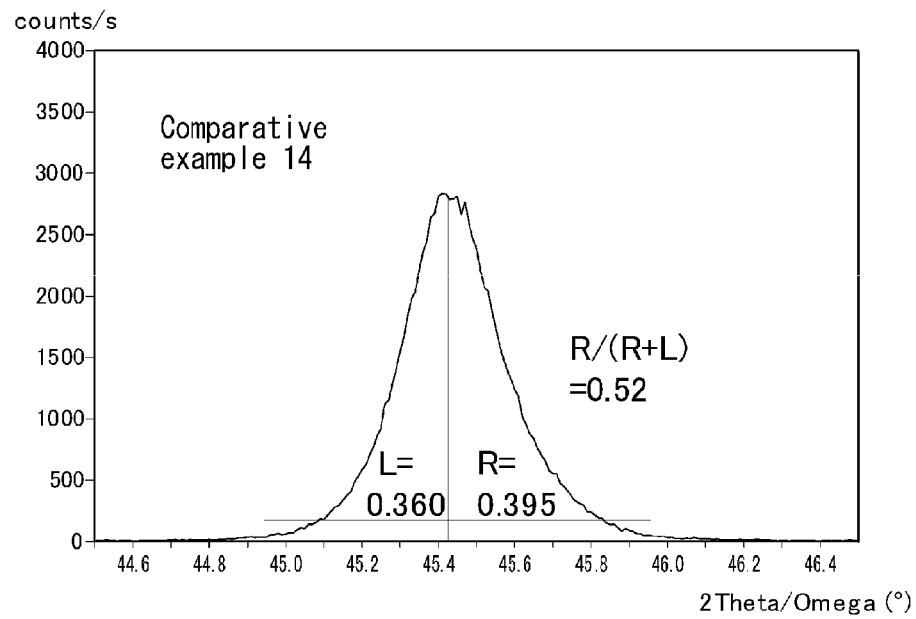
FIG. 8 is a profile of a KNN (002) diffraction peak of comparative example 14.
Figure 9:
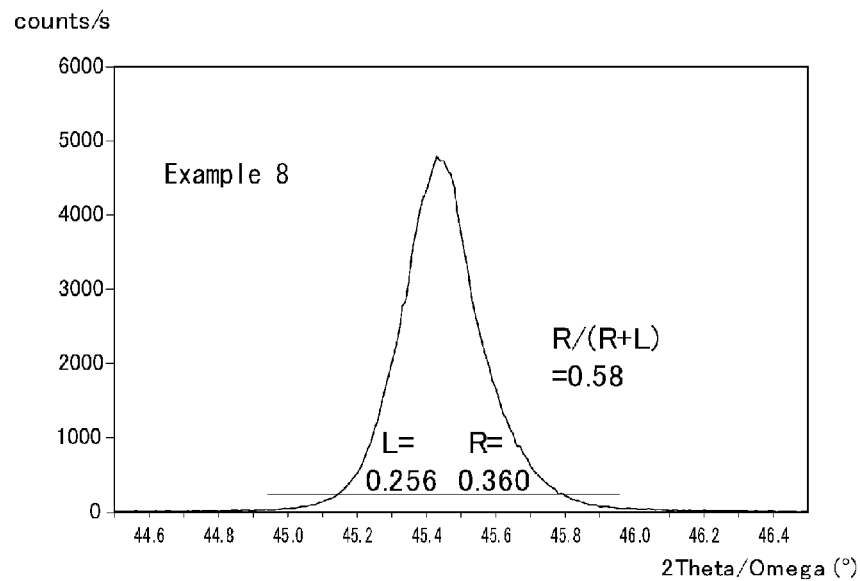
FIG. 9 is a profile of a KNN (002) diffraction peak of example 8.
Figure 10:
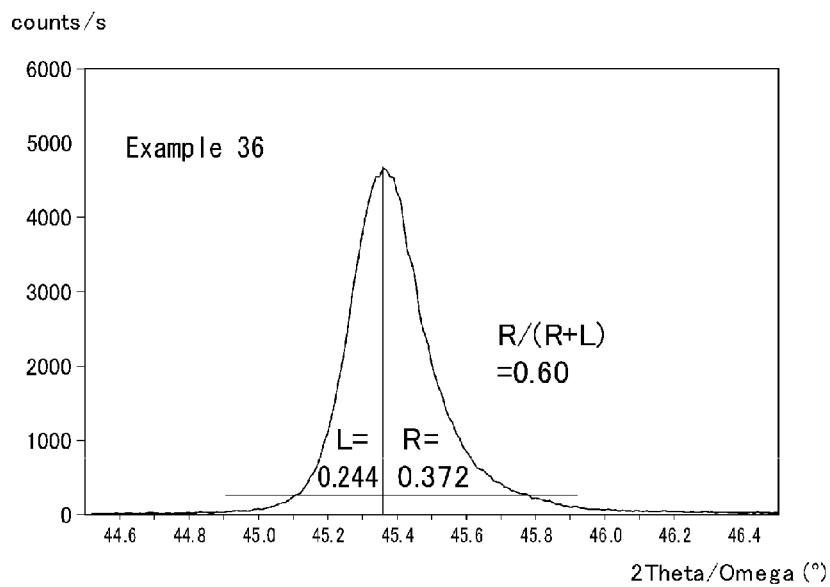
FIG. 10 is a profile of a KNN (002) diffraction peak of example 36.

Next, in order to evaluate piezoelectric characteristics, a unimorph cantilever having a structure as shown in FIG. 6A and FIG. 6B were prepared. In preparing the unimorph cantilever, a simple unimorph cantilever was constructed by fixing a longitudinal end of the piezoelectric thin film element 10 by a clamp 20 (FIG. 6(a)). In this state, voltage was applied to the KNN piezoelectric thin film 4 between the upper electrode 5 and the lower electrode 3, and the KNN piezoelectric thin film 4 was extended and contracted, to thereby actuate an entire body of the cantilever to bend and actuate a tip end (free end) of the cantilever to displace. Such a displacement of the tip end was measured by a laser Doppler displacement meter 21 (FIG. 6B).

The piezoelectric constant $d_{31}$ was calculated from the displacement of the cantilever tip end, the length of the cantilever, the thickness and the Young's modulus of the substrate and the thin film, and an applying voltage. A value of the piezoelectric constant $d_{31}$ was measured by applying an electric field of 30 kV/cm. As a calculation method of the piezoelectric constant $d_{31}$, a method described in document (T. Mino, S. Kuwajima, T. Suzuki, I. Kanno, H. Kotera. and K. Wasa: Jpn. Appl. Phys. 46 (2007)6960) wad used. The Young's modulus, 104 GPa, of the KNN thin film was also used.

A list of sputter film forming conditions (film forming rate, film forming temperature, plasma power) of the examples 1 to 49, comparative examples 1 to 9, and reference example 1 and 2 presence/absence of heat treatment after film formation,
Na/(K+Na) composition ratio of the KNN film (Na composition ratio), KNN (002) diffraction peak shape, and piezoelectric constant $d_{31}$, is shown in FIG. 14A to FIG. 14D.

Also, a profile of the KNN (002) diffraction peak of comparative example 1, example 8, example 14, and example 36 extracted from the list are shown in FIG. 7 to FIG. 10.

From FIG. 14A to FIG. 14D, it is found that when the intensity of the lower angle side skirt field is stronger than the intensity of the higher angle side skirt field of the KNN (002) diffraction peak, in other words, when R/(R+L) exceeds 0.50, the piezoelectric constant is high compared with an otherwise case, and it is possible to stably obtain the characteristic that the piezoelectric constant $d_{31}$ is −68 pm/V or more. Particularly, it is found that when R/(R+L) is 0.54 or more, it is possible to stably obtain the characteristic that the piezoelectric constant $d_{31}$ is −90 pm/V or more. Examples 6, 8, 9, 11 to 13, 15, 16, 20, 21, 26, 28 to 42, 44, 45, 48, and 49 are given as examples in which R/(R+L) is 0.54 or more. Further, it is found that when the heat treatment is applied after forming the KNN piezoelectric thin film, the characteristic that the piezoelectric constant $d_{31}$ is −100 pm/V or more can be stably obtained, compared with a case that heat treatment is not applied. Further, the $(K_{1-x}Na_x)NbO_3$ sintered compact expressed by (K+Na)/Nb=1.0, Na/(K+Na)=0.50 to 0.65 was used as a target, when the KNN piezoelectric thin film is formed by sputtering. Therefore, it is found that the Na/(K+Na) composition of the obtained $(K_{1-x}Na_x)NbO_3$ piezoelectric thin film is set in a range of $0.49 \leq x \leq 0.63$.

Note that in the reference examples 1 and 2, R/(R+L) did no exceed 50, although the heat treatment was applied. The reason therefore is considered that a state before annealing is extremely closer to the orthorhombic crystal. In the reference example 2, the piezoelectric constant 80 could be obtained, although R/(R+L) did not exceed 50. However, the piezoelectric element of the reference example 2 involved a problem in the point of reproducibility. Meanwhile, according to the present invention, by suitably determining the sputter film forming conditions and heat treatment conditions, excellent MPB state can be realized in the KNN thin film, and therefore the piezoelectric thin film element having high piezoelectric constant can be stably provided.

Figure 11:
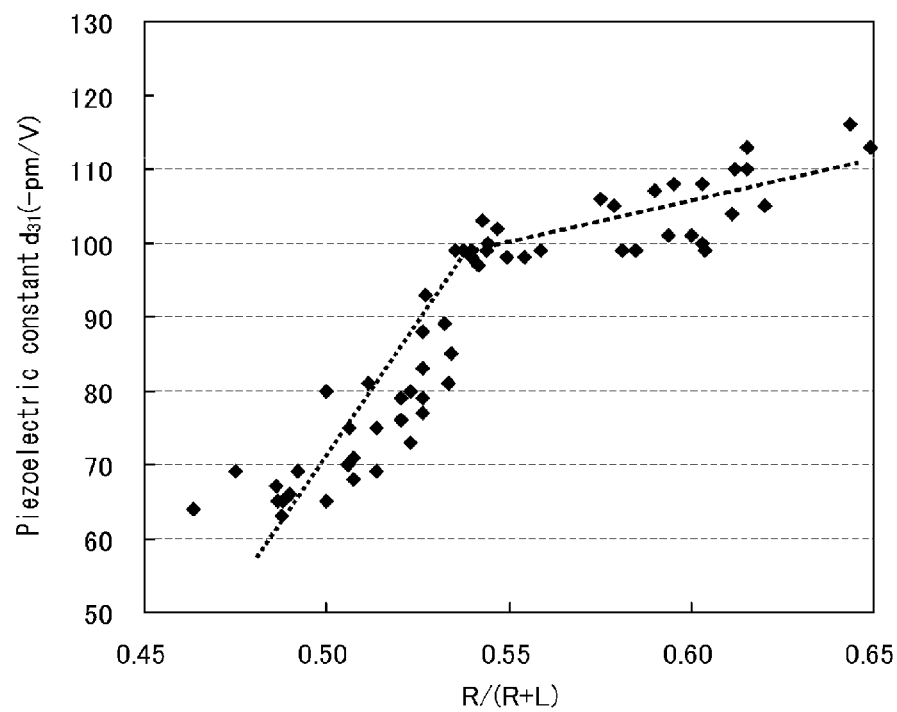
FIG. 11 is a relation view of R/(R+L) and piezoelectric constant $d_{31}$, between the example and the comparative example.
Figure 12:
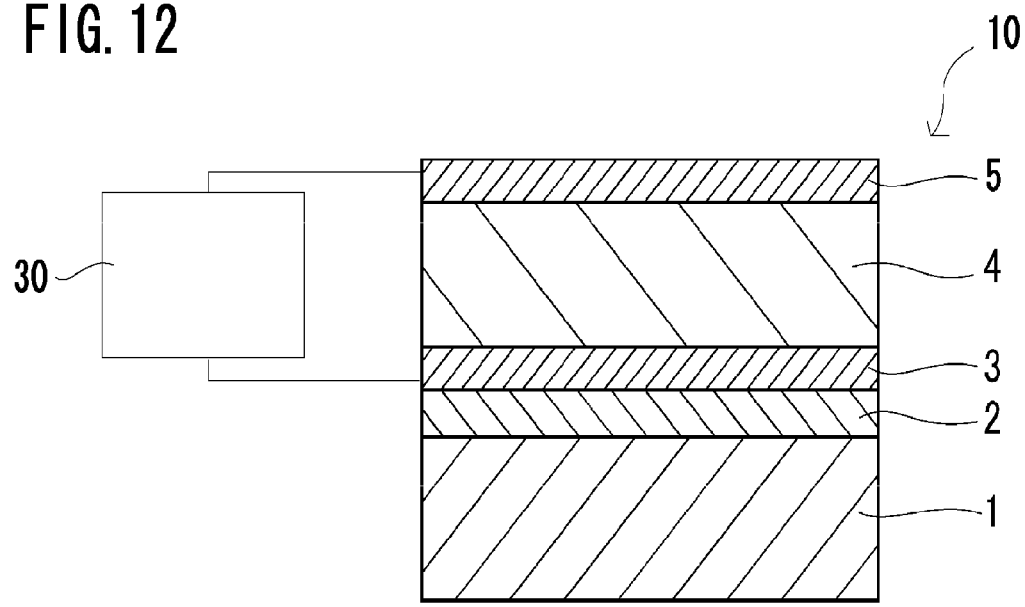
FIG. 12 is a sectional view of a piezoelectric thin film device using the piezoelectric thin film according to an embodiment of the present invention.

The relation between R/(R+L) and the piezoelectric constant $d_{31}$ concluded from the result of FIG. 14A to FIG. 14D is shown in FIG. 11. Particularly, it is intuitively found that when R/(R+L) is 0.54 or more, it is possible to stably obtain the characteristic that the piezoelectric constant $d_{31}$ is −90 pm/V or more. Further, from the result obtained this time, there is a tendency that as the value of R/(R+L) becomes greater, the value of $d_{31}$ also becomes greater.

From the relation between R/(R+L) and the piezoelectric constant $d_{31}$ shown in FIG. 11, it is found that the piezoelectric constant $d_{31}$ becomes apparently smaller, when the value of R/(R+L) is under 0.54. Then, when the value of R/(R+L) is under 0.50, it is found that required piezoelectric characteristics can not be obtained.

In the aforementioned examples, explanation has been given by using the piezoelectric thin film element in which the lower electrode composed of the Pt thin film is formed on the substrate. By using such a piezoelectric thin film element, a small-sized system device such as a small-sized motor, sensor, and actuator (for example, Micro Electric Mechanical System (MEMS)) can be formed.

Further, a filter device can also be formed, in which the piezoelectric thin film is formed on the substrate and an electrode of a prescribed shape (pattern) is formed on the piezoelectric thin film, and a surface elastic wave is utilized.

Figure 13:
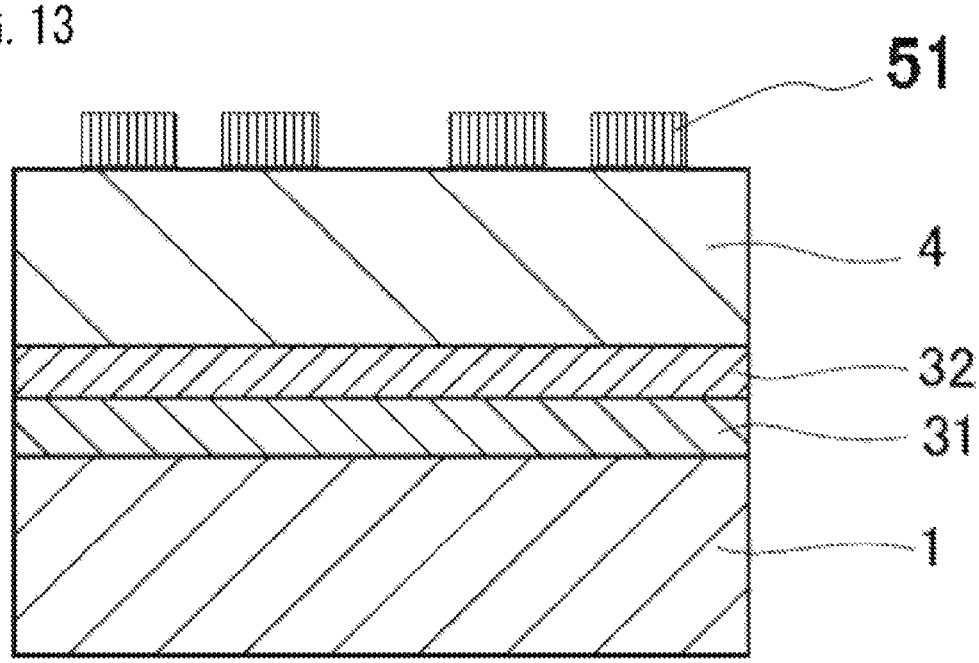
FIG. 13 is a sectional view of a filter device, using the piezoelectric thin film according to an embodiment of the present invention.

In the aforementioned examples, the Pt thin film is used as the orientation control layer. However, LaNiO3 which is easily oriented in (001) surface can also be used instead of the Pt thin film. FIG. 13 shows the filter device in which LaNiO3 layer 31, NaNbO3 layer 32, KNN thin film 4, and upper pattern electrode 51 are formed on the Si substrate. In such a filter device as well, excellent sensitivity characteristic is exhibited when the intensity ratio R/(R+L) of the lower angle side skirt field of the KNN (002) diffraction peak of the KNN thin film is 0.54 or more.

What is claimed is:

1. A piezoelectric thin film element comprising: a piezoelectric thin film having an alkali niobium oxide series perovskite structure expressed by a general formula $(K_{1-x}Na_x)NbO_3(0<x<1)$ provided on a substrate,
    wherein the piezoelectric thin film has a KNN (002) diffraction peak of $2\theta=43$ to $47°$ in an X-ray diffraction $2\theta/\theta$ pattern, and in the KNN (002) diffraction peak, an intensity of a higher angle side skirt field is stronger than an intensity of a lower angle side skirt field; and
    wherein a crystal structure of the $(K_{1-x}Na_x)NbO_3(0<X<1)$ is formed of a phase boundary state of a pseudo-cubic crystal and an orthorhombic crystal.

2. A piezoelectric thin film element comprising: a piezoelectric thin film having an alkali niobium oxide series perovskite structure expressed by a general formula $(K_{1-x}Na_x)NbO_3(0<x<1)$ provided on a silicon substrate,
    wherein the piezoelectric thin film has a KNN (002) diffraction peak of $2\theta=43$ to $47°$ in an X-ray diffraction $2\theta/\theta$ pattern, and in the KNN (002) diffraction peak, when the diffraction peak angle is denoted by $(2\theta_p)$, an angle showing an intensity of $\frac{1}{20}$ of the diffraction peak in the lower angle side skirt field is denoted by $(2\theta_{L1/20})$, an angle showing the intensity of $\frac{1}{20}$ of the diffraction peak in the higher angle side skirt field is denoted by $(2\theta_{R1/20})$, and R and L are defined as $R=(2\theta_{R1/20})-(2\theta_P)$, $L=(2\theta_p)-(2\theta_{L1/20})$, a value of $R/(R+L)$ is 0.54 or more; and
    wherein a crystal structure of the $(K_{1-x}Na_x)NbO_3(0<X<1)$ is formed of a phase boundary state of a pseudo-cubic crystal and an orthorhombic crystal.

3. The piezoelectric thin film element according to claim 1, wherein Na composition ratio x of the piezoelectric thin film having an alkali niobate oxide series perovskite structure expressed by the general formula $(K_{1-x}Na_x)NbO_3(0<x<1)$, satisfies $0.49 \leq x \leq 0.63$.

4. The piezoelectric thin film element according to claim 2, wherein Na composition ratio x of the piezoelectric thin film having an alkali niobate oxide series perovskite structure expressed by the general formula $(K_{1-x}Na_x)NbO_3(0<X<1)$, satisfies $0.49 \leq x \leq 0.63$.

5. A piezoelectric thin film device, comprising the piezoelectric thin film element according to claim 1, wherein the piezoelectric thin film element comprises:
    a lower electrode provided between the substrate and the piezoelectric thin film; and
    an upper electrode formed on the piezoelectric thin film.

6. A piezoelectric thin film device, comprising the piezoelectric thin film element according to claim 2, wherein the piezoelectric thin film element comprises:
    a lower electrode provided between the substrate and the piezoelectric thin film; and
    an upper electrode formed on the piezoelectric thin film.

7. A piezoelectric thin film device, comprising:
    the piezoelectric thin film element according to claim 3; and
    a voltage applying part or a voltage detecting part.

8. A piezoelectric thin film device, comprising:
    the piezoelectric thin film element according to claim 4; and
    a voltage applying part or a voltage detecting part.

* * * * *